US010101508B2

(12) United States Patent
Cho et al.

(10) Patent No.: US 10,101,508 B2
(45) Date of Patent: Oct. 16, 2018

(54) APPARATUS FOR FORMING AN OPTICAL PATTERN

(71) Applicant: SAMSUNG DISPLAY CO., LTD., Yongin-si, Gyeonggi-Do (KR)

(72) Inventors: Young Suk Cho, Seoul (KR); Tae Min Kang, Suwon-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 14/929,444

(22) Filed: Nov. 2, 2015

(65) Prior Publication Data

US 2016/0215380 A1 Jul. 28, 2016

(30) Foreign Application Priority Data

Jan. 27, 2015 (KR) .................. 10-2015-0013041

(51) Int. Cl.
| | |
|---|---|
| C23C 14/00 | (2006.01) |
| G02B 5/02 | (2006.01) |
| G02B 5/10 | (2006.01) |
| G03F 7/00 | (2006.01) |
| G03F 7/20 | (2006.01) |

(52) U.S. Cl.
CPC ............ *G02B 5/10* (2013.01); *G03F 7/0007* (2013.01); *G03F 7/2008* (2013.01); *G03F 7/70* (2013.01); *G02B 5/0278* (2013.01); *G02B 5/0284* (2013.01)

(58) Field of Classification Search
None
See application file for complete search history.

(56) References Cited

U.S. PATENT DOCUMENTS

| | | | |
|---|---|---|---|
| 5,975,709 A | * | 11/1999 | Ebinuma .................. G02B 5/10 359/845 |
| 7,993,945 B2 | | 8/2011 | Ikeda et al. |
| 8,071,404 B2 | | 12/2011 | Yamazaki et al. |
| 2010/0035371 A1 | * | 2/2010 | Yamazaki ............. C23C 14/048 438/29 |
| 2010/0165313 A1 | * | 7/2010 | Nawata ................ G01M 11/005 355/66 |

FOREIGN PATENT DOCUMENTS

| | | |
|---|---|---|
| KR | 10-0700641 B1 | 3/2007 |
| KR | 10-2012-0004214 A | 1/2012 |
| KR | 10-2014-0005464 A | 1/2014 |

* cited by examiner

*Primary Examiner* — Jethro M Pence
(74) *Attorney, Agent, or Firm* — Lee & Morse, P.C.

(57) ABSTRACT

An apparatus for forming an optical pattern includes a vacuum chamber, a mount on which a substrate to be prepared using a mask is to be supported, a diffusion unit adjacent the mask, spaced apart from the mask by a preset interval, and facing the mask, the diffusion unit to diffuse light incident thereon as uniform surface light and transmit the uniform surface light to the mask, and a light source unit spaced in a lateral direction from the diffusion unit, the light source unit to generate light to be incident on the diffusion unit.

15 Claims, 3 Drawing Sheets

APPARATUS FOR FORMING AN OPTICAL PATTERN

CROSS-REFERENCE TO RELATED APPLICATION

Korean Patent Application No. 10-2015-0013041, filed on Jan. 27, 2015, in the Korean Intellectual Property Office, and entitled: "Apparatus for Forming Optical Pattern," is incorporated by reference herein in its entirety.

BACKGROUND

1. Field

The described technology relates generally to an apparatus for forming an optical pattern.

2. Description of the Related Art

In general, in an optical patterning method using light sources and a mask, light emitted from light sources onto a mask is selectively absorbed by the mask and converted into thermal energy to allow an organic material deposited on the mask to be deposited to predetermined pixels of a substrate.

In order to uniformly maintain a distribution of light incident to the substrate and the mask, the light sources are positioned at predetermined intervals below or above the mask. In order to realize a transfer pattern to a large panel, numerous light sources are installed in a lower end. Also, in order to allow light, which has passed through the light sources, to be incident to the mask without an obstacle, a window allowing light to be transmitted therethrough is installed in a lower end of a vacuum chamber. As a size of the mask increases, a size of the window increases, and in order to maintain a predetermined vacuum state of the vacuum chamber, a thick window is used according to sizes of substrates.

Since numerous light sources are installed to realize a transfer pattern to a large panel, it may be difficult to configure equipment for manufacturing a large display device. Also, as a size of a window increases, the window may be bent due to vacuum in severe cases.

The above information disclosed in this Background section is only for enhancement of understanding of the background of the described technology and therefore it may contain information that does not form the prior art that is already known to a person of ordinary skill in the art.

SUMMARY

An exemplary embodiment provides an apparatus for forming an optical pattern, the apparatus including a vacuum chamber, a mount on which a substrate to be prepared using a mask is to be supported, a diffusion unit adjacent the mount, spaced apart from the mount by a preset interval, and facing the mount, the diffusion unit to diffuse light incident thereon as uniform surface light and transmit the uniform surface light to the mount, and a light source unit spaced in a lateral direction from the diffusion unit, the light source unit to generate light to be incident on the diffusion unit.

The light source unit may be outside the vacuum chamber.

The apparatus may include a first reflection unit at a preset angle in a light transmission path between the light source unit and the diffusion unit, the first reflection unit to supply light transmitted from the light source unit to the diffusion unit.

The first reflection unit may be within the vacuum chamber.

The diffusion unit may be in the vacuum chamber and the vacuum chamber may include a transmission region at a corresponding position between the light source unit and the first reflection unit on one side of the vacuum chamber to allow light generated by the light source unit to be transmitted to the interior of the vacuum chamber.

The light source unit may include a light source to generate light, and a light reflection unit in the vicinity of the light source, the light reflection unit having a concave shape partially encircling the light source.

The light source unit may include a first light source unit at a first side of the diffusion unit in a length direction, and a second light source unit at a second side of the diffusion unit, opposite the first side, in the length direction.

The diffusion unit may include a diffusion plate and a plurality of lens units positioned at equal intervals on an upper surface of the diffusion plate.

The plurality of lens units may have a triangular cross-sectional shape.

Each of the plurality of lens units may have a shape in which a lower portion thereof in contact with the diffusion plate is larger than an upper portion thereof facing the mask and which becomes sharp upwardly.

The apparatus may include a second reflection unit adjacent the diffusion unit, the second reflection unit to reflect light incident thereon in a direction toward the diffusion unit.

The second reflection unit may extend in a length direction of the diffusion plate, and may have a concave shape partially encircling the diffusion plate.

The apparatus may include an auxiliary chamber adjacent the vacuum chamber, wherein the first reflection unit, the light source unit, and the diffusion unit are within the auxiliary chamber.

The apparatus may include a transmission region at a corresponding position between the diffusion unit and the vacuum chamber to allow light output from the diffusion unit to be transmitted to the interior of the vacuum chamber.

The light source unit may include a light source to generate light and a light reflection unit in the vicinity of the light source, the light reflection unit having a concave shape partially encircling the light source.

The diffusion unit and the light source unit may be in the vacuum chamber.

The diffusion unit may be below the mount.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Technical terms used in the present specification are used only in order to describe specific exemplary embodiments rather than limiting the disclosure. The terms of a singular form may include plural forms unless referred to the contrary. It will be further understood that the terms "comprise" and/or "comprising," when used herein, specify the presence of stated features, regions, integers, steps, operations, elements, and/or components, but do not preclude the presence or addition of one or more other features, regions, integers, steps, operations, elements, components, and/or groups thereof.

Unless indicated otherwise, it is to be understood that all the terms used in the specification, including technical and scientific terms have the same meaning as those that are understood by those skilled in the art to which the present invention pertains. It must be understood that the terms defined by the dictionary are identical with the meanings within the context of the related art, and they should not be ideally or excessively formally defined unless the context clearly dictates otherwise.

Figure 1:
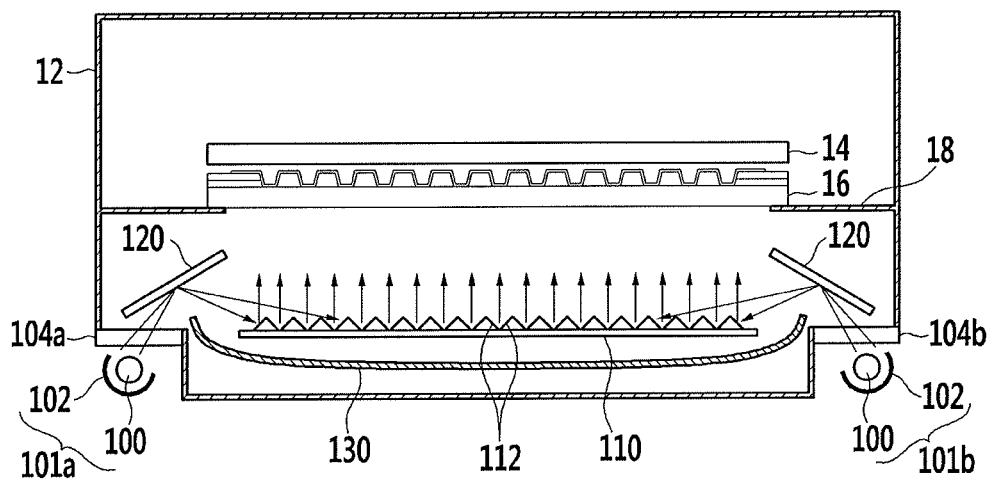
FIG. 1 illustrates an apparatus for forming an optical pattern according to an exemplary embodiment.
Figure 1:
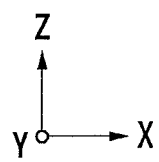

FIG. 1 is a view illustrating an apparatus for forming an optical pattern according to an exemplary embodiment. Referring to FIG. 1, an apparatus 10 for forming an optical pattern includes a vacuum chamber 12 in which a substrate 14 is to be prepared using a mask 16, a mount 18 to support the substrate 14, diffusion units 110 and 112, and light source units 101a and 101b.

The substrate 14 and the mask 16 are disposed within the vacuum chamber 12. The vacuum chamber 12 according to an exemplary embodiment of the present disclosure may have an appropriate degree of vacuum maintained therein, and may have various shapes according to shapes of the substrate 14. The mask 16 is disposed below the substrate 14, and may be formed as a transfer mask having a preset optical pattern. The mask 16 may include a reflective layer reflecting light in a predetermined pattern and an absorption layer absorbing light and converting the absorbed light into thermal energy. As the vacuum chamber 12, the substrate 14, the mask 16, and the like, described above, components used in a general optical pattern forming apparatus may be applied, and thus, detailed descriptions thereof will be omitted.

The apparatus for forming an optical pattern according to an exemplary embodiment may further include a first reflection unit 120 provided at a preset angle in a light transmission path between the light source units 100 and 102 and the diffusion units 110 and 112 and supplying light transmitted from the light source units 101a and 101b to the diffusion units 110 and 112. That is, the light source units 101a and 101b are positioned on the side of the diffusion units 110 and 112, and configured to allow light to be incident to the diffusion units 110 and 112 through the first reflection unit 120 from the light source 100. The first reflection unit 120 may be disposed within the vacuum chamber 12 and may include a transmission part 104 provided in a corresponding position between the light source units 100 and 102 and the first reflection unit 120 on one side of the vacuum chamber 12 to allow light generated by the light source units 100 and 102 to be transmitted to the interior of the vacuum chamber 12.

The diffusion units 110 and 112 may be provided adjacent, e.g., below, the mask 16, may be spaced apart from the mask 16 by a preset interval, and may face the mask 16. The diffusion units 110 and 112 diffuse light transmitted from the light source units 100 and 102, as uniform surface light and transmit the same to the mask 16. The diffusion units 110 and 112 may include a diffusion plate 110 having a plate shape and a plurality of lens units 112 positioned at equal intervals on an upper surface of the diffusion plate 110. The diffusion plate 110 scatters and normalizes light incident from a point source to convert the same into a surface light, e.g., a continuous line of light. The plurality of lens units 112 transmit incident light to the mask 16 such that the light is parallel to the mask 16. The plurality of lens units 112 on the diffusion plate 110 scatters light output from the diffusion plate 110 to normalize luminance, e.g., make the line of light have uniform luminance.

The plurality of lens units 112 may have a triangular cross-sectional shape, and the plurality of lens units 112 may have a prism structure. For example, each of the plurality of lens units 112 may have a shape in which a lower portion thereof in contact with the diffusion plate 110 is larger than an upper portion thereof facing the mask 16 and which becomes sharp upwardly. Thus, light incident to the plurality of lens units 12 may be uniformly transmitted to the mask 16 through the upper sharp shape.

The apparatus 10 for forming an optical pattern may further include a second reflection unit 130, adjacent, e.g., below, the diffusion units 110 and 112, that reflects incident light toward the diffusion units 110 and 112. The second reflection unit 130 reflects light incident through the diffusion units 110 and 112 back to the plurality of lens units 112. To this end, the second reflection unit 130 extends in a length direction of the diffusion plate 110, and may have a concave shape encircling, e.g., partially encircling, the diffusion plate 110. In particular the second reflection unit 130 may overlap, e.g., completely overlap, the diffusion units 110 and 112 along the x- and y-directions, and may have ends thereof extending to overlap, e.g., completely overlap, sides of the diffusion units 110 and 112 along the z-direction. Through the second reflection unit 130, light transmitted from the light source units 100 and 102 may be reflected to the diffusion plate 110, and light diffused as surface light through the diffusion plate 110 may be uniformly transmitted to the mask 16. That is, since the second reflection unit 130 is concave facing the diffusion units 110 and 112, the second reflection unit 130 may guide light from the light source units 100 and 102 to be transmitted to the diffusion units 110 and 112 and incident to the mask 16. The second reflection unit 130 may provide directionality to light diffused through the diffusion units 110 and 112 in a predetermined direction.

The light source units 101a and 101b may be disposed in a lateral direction of the diffusion units 110 and 112, e.g., spaced apart from the diffusion units 110 and 112 along all three axes, and generate light to be transmitted to the diffusion units 110 and 112. Each light source unit 101a and 101b may include a light source 100 generating light to be incident to the mask 16 and a light reflection unit 102 provided in the vicinity of the light source 100 and having a concave shape encircling, e.g., partially encircling, the light source 100.

When the light source 100 is oriented upwardly below the mask 16, upward parallel light needs to be created. Thus, a large number of light sources 100 need to be disposed below the mask 16 in a direction perpendicular to the mask 16. Alternatively, even when the light source 100 is above the mask 16 in a direction perpendicular to the mask 16, a large number of light sources 100 need to be disposed above the mask 16 in a direction perpendicular to the mask 16. That is, whether the light sources 100 are positioned below or above the substrate 14 and the mask 16 in a direction perpendicular to the substrate 14 and the mask 16, in order to uniformly maintain a distribution of the light sources 100 incident to the substrate 14 and the mask 16, when the substrate 14 is manufactured to have a large area, the number of light sources 100 increases, leading to difficulty in manufacturing a large panel.

The light source 100 may include a flash lamp or a laser, and may include a light source 100 having every wavelength allowing for energy transmission through light. As illustrated in FIG. 1, the light source units 101 and 101b may be disposed outside the vacuum chamber 12. Since the light source units 101a and 101b may be selectively installed outside the vacuum chamber 12, it is easy to maintain and manage the light source 100 during a vacuum deposition process of a large panel. Also, since the light source units 101a and 101b are outside the vacuum chamber 12, the light source units 101a and 101b may be easily installed and detached.

The light source units 101a and 101b may include a first light source unit provided on a first side of the diffusion units 110 and 112 in a length direction and a second light source unit provided on a second side of the diffusion units 110 and 112, opposite the first side, in the length direction. While the number of the light source units 101a and 101b is shown as two in FIG. 1, there may be more than two light source units. When two light source units 101a and 101b are provided, the light source units 101a and 101b may be disposed in a direction perpendicular to a cross-section of the vacuum chamber 12. Thus, a number of light sources 100 may be reduced, and uniformity of light incident to the mask 16 may be maintained, realizing a large optical pattern with high resolution.

When light sources 100 are outside the vacuum chamber 12, if an obstacle is present between the light source 100 and the mask 16, it may be difficult for light to reach the mask 16. In particular, when the mask 16 is large, a predetermined proportion of light is incident to the entire surface of the mask 16, and thus, an obstacle interfering in an optical path between the light source 100 and the mask 16 should be removed, and the optical path should not be obstructed. Also, in order for light emitted from the light source 100 to be incident to the mask 16 without an obstacle, a window allowing for transmission of light is required in a lower end of the vacuum chamber 12, and here, in order to manufacture a large panel, a size of the window inevitably increases, leading to a problem in which the window may be bent. Also, if the window is thickened to prevent bending, a path of light emitted from the light source 100, or the like, may be interfered.

The transmission region 104 positioned between the light source 100 and the mask 16 may be removed as necessary, and when the transmission region 104 is present, it may need to have a thickness appropriate for minimizing bending. The transmission region 104 may include a window that allows transmission of light for use in the apparatus 10. The transmission region 104 allowing uniform light from the light source 100 to be incident to the mask 16 may increase in proportion to sizes of the mask 16 and the substrate 14. However, a large transmission region 104 may be bent within the vacuum chamber 12. In order to prevent bending of the window, the window needs to be thickened according to an increase in the size thereof. Thus, the window between the light source 100 and the mask 16 needs to be selectively installed only in a required portion. For this reason, the transmission region 104 according to an exemplary embodiment may include a first transmission region 104a provided in a position corresponding to a first light source unit 101a and a second transmission region 104b provided in a position corresponding to a second light source unit 101b. Since the first transmission region 104a and the second transmission region 104b are provided, a structure in which a path along which light emitted the light source 100 passes is not interfered and an overall size of the transmission region 104 is not to be large may be realized.

Figure 2:
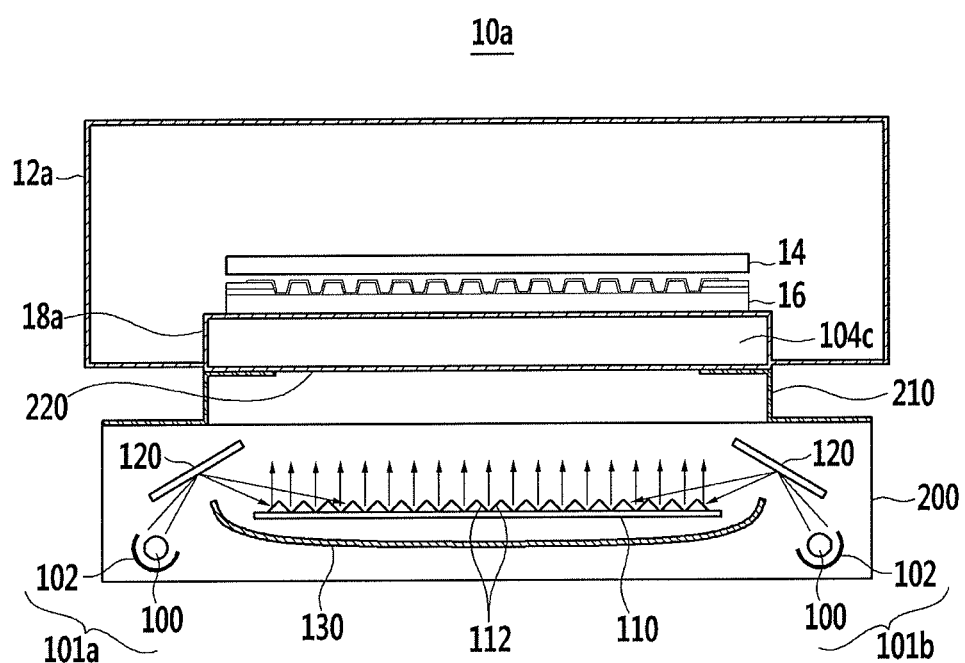
FIG. 2 illustrates an apparatus for forming an optical pattern according to an exemplary embodiment.

FIG. 2 illustrates an apparatus 10a for forming an optical pattern according to an exemplary embodiment. As shown in FIG. 2, the light source units 101a and 101b, and diffusion units 110 and 112 are in an auxiliary chamber 200. For example, the auxiliary chamber 200 is provided adjacent, e.g., below, a vacuum chamber 12a, and a transmission region 104c is between the vacuum chamber 12a and the auxiliary chamber 200. The substrate 14 and the mask 16 are provided within the vacuum chamber 12a. The auxiliary chamber 200 includes diffusion units 101a and 101b, light source units 101a and 101b, the first reflection unit 120, and the second reflection unit 130. With this configuration, a path along which light generated by the light source units 101a and 101b passes is not interfered and a size of the transmission region 104c increases. As shown in FIG. 2, the auxiliary substrate 200 may include a stepped portion 210 having a gap 220 therein and the vacuum chamber 12a may include a transparent mount 18a, together which provide the transmission region 104c.

Figure 3:
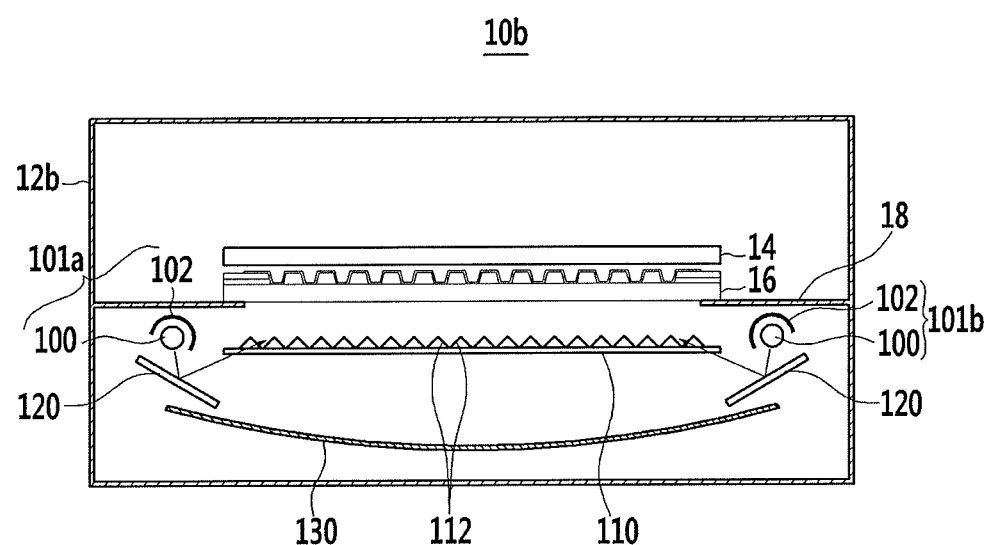
FIG. 3 illustrates an apparatus for forming an optical pattern according to an exemplary embodiment.

FIG. 3 is a view illustrating an apparatus 10b for forming an optical pattern according to an exemplary embodiment. As shown in FIG. 3, the light source units 101a and 101b are within a vacuum chamber 12b. Referring to FIG. 3, the substrate 14 and the mask 16 are within the vacuum chamber 12b on the mount 18, and diffusion units 110 and 112, light source units 101a and 101b, the first reflection unit 120, and the second reflection unit 130 are provided within the vacuum chamber 12b. In such a case, a transmission region, e.g., a window, between the light source units 100 and 102 and the mask 16 may be removed.

Referring to FIGS. 1 through 3, in the exemplary embodiments, a minimum number of light sources 100 may be used, the light sources 100 may be easily maintained and repaired, and the vacuum chamber 12 in which the substrate 14 and the mask 16 are to be disposed therein is easily configured to be applied to an optical patterning deposition process of a large panel. The light source 100 may be disposed within or outside the vacuum chamber 12. That is, the light source 100 may be disposed outside the vacuum chamber 12 or 12a as illustrated in FIGS. 1 and 2. Also, the light source 100 may be disposed within the vacuum chamber 12b as illustrated in FIG. 3. The light source 100 may be positioned on the side of the mask 16. If necessary, the light source 100 may be disposed in a vertical direction below the mask 16. In such a case, an obstacle interfering with an optical path formed between the light source 100 and the mask 16 should not be present. Thus, the first reflection unit 120 supplying light transmitted from the light source units 100 and 102 to the diffusion units 110 and 112 may be removed.

As described above, in an exemplary embodiment, light emitted from at least one light source 100 provided within or outside the vacuum chamber 12 may be diffused and light may be collected in a predetermined direction. Thus, uniform light may be incident to the large mask 16, while the minimum number of light sources 100 $m$ used. Also, the minimum number of light sources 100 may be disposed outside the vacuum chamber 12 to facilitate maintenance of the light source 100. Also, since the transmission part 104 used not to block incident light toward the mask 16 is selectively used, the vacuum chamber 12 may be easily configured.

By way of summation and review, according to one or more embodiments, since the number of light sources in use is reduced, maintenance of the light sources may be facilitated, and since light transmitted from the light sources is uniformly incident to the mask, a large optical pattern with high resolution may be realized.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An apparatus for forming an optical pattern, the apparatus comprising:
    a vacuum chamber;
    a mount on which a substrate to be prepared using a mask is to be supported;
    a diffuser adjacent the mount, spaced apart from the mount by a preset interval in a first direction, and facing the mount;
    a first light source to generate light, the first light source being spaced in a second direction, orthogonal to the first direction, from the diffuser and on a first side of the diffuser along the second direction;
    a second light source to generate light independent of the first light source, the second light source at a second side of the diffuser opposite the first side along the second direction, the second light source being spaced in the second direction from the diffuser;
    a first reflector at a preset angle in a first light transmission path between the first light source and the diffuser, the first reflector to direct light from the first light source to the diffuser; and
    a second reflector at a preset angle in a second light transmission path between the second light source and the diffuser, the second reflector to direct light from the second light source to the diffuser, the first and second reflectors being spaced apart along the second direction, wherein
    the first and second light transmission paths are independent, and
    the diffuser diffuses light transmitted from the first and second light sources as uniform surface light and transmits the uniform surface light to the mount along the first direction.

2. The apparatus as claimed in claim 1, wherein the first and second light sources are outside the vacuum chamber.

3. The apparatus as claimed in claim 1, wherein the first and second reflectors are within the vacuum chamber.

4. The apparatus as claimed in claim 3, wherein the diffuser is in the vacuum chamber and the vacuum chamber includes:
    a first transmission region at a corresponding position between the first light source and the first reflector on one side of the vacuum chamber to allow light generated by the first light source to be transmitted to an interior of the vacuum chamber; and
    a second transmission region at a corresponding position between the second light source and the second reflector on one side of the vacuum chamber to allow light generated by the second light source to be transmitted to the interior of the vacuum chamber.

5. The apparatus as claimed in claim 4, further comprising:
    a first light reflector adjacent the first light source, the first light reflector having a concave shape partially encircling the first light source.

6. The apparatus as claimed in claim 4, wherein the diffuser includes:
    a diffusion plate; and
    a plurality of lenses positioned at equal intervals on an upper surface of the diffusion plate.

7. The apparatus as claimed in claim 6, wherein the plurality of lenses have a triangular cross-sectional shape.

8. The apparatus as claimed in claim 6, wherein each of the plurality of lenses has a shape in which a lower portion thereof in contact with the diffusion plate is larger than an upper portion thereof facing the mask and which becomes sharp upwardly.

9. The apparatus as claimed in claim 6, further comprising:
    a diffusion reflector adjacent the diffuser, the diffusion reflector to reflect light incident thereon in a direction toward the diffuser.

10. The apparatus as claimed in claim 9, wherein the diffusion reflector extends in a length direction of the diffusion plate, and has a concave shape partially encircling the diffusion plate.

11. The apparatus as claimed in claim 1, further comprising:
    an auxiliary chamber adjacent the vacuum chamber, wherein the first and second reflectors, the first and second light sources, and the diffuser are within the auxiliary chamber.

12. The apparatus as claimed in claim 11, further comprising:
    a transmission region at a corresponding position between the diffuser and the vacuum chamber to allow light output from the diffuser to be transmitted to the interior of the vacuum chamber.

13. The apparatus as claimed in claim 12, further comprising:
    a light reflector adjacent the first light source, the light reflector having a concave shape partially encircling the first light source.

14. The apparatus as claimed in claim 1, wherein the diffuser and the first and second light sources are in the vacuum chamber.

15. The apparatus as claimed in claim 1, wherein the diffuser is below the mount.

* * * * *